United States Patent
Chang et al.

(10) Patent No.: US 7,904,844 B2
(45) Date of Patent: *Mar. 8, 2011

(54) SYSTEM, METHOD, AND COMPUTER PROGRAM PRODUCT FOR MATCHING CELL LAYOUT OF AN INTEGRATED CIRCUIT DESIGN

(75) Inventors: Gwan Sin Chang, Hsinchu (TW); Cheng-Hung Yeh, Jhunan Township, Miaoli County (TW); Feng-Ming Chang, Chia-yi (TW); Ping-Wei Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 156 days.

This patent is subject to a terminal disclaimer.

(21) Appl. No.: 11/949,311

(22) Filed: Dec. 3, 2007

(65) Prior Publication Data

US 2008/0244482 A1    Oct. 2, 2008

Related U.S. Application Data

(60) Provisional application No. 60/909,270, filed on Mar. 30, 2007.

(51) Int. Cl.
*G06F 17/50*    (2006.01)
(52) U.S. Cl. .............. 716/4; 716/1; 716/5; 716/8; 716/9; 716/10; 716/18
(58) Field of Classification Search .................. 716/1–5, 716/8–11, 18, 19–21
See application file for complete search history.

(56) References Cited

U.S. PATENT DOCUMENTS

| | | | |
|---|---|---|---|
| 5,847,965 A | 12/1998 | Cheng | |
| 6,077,310 A | 6/2000 | Yamamoto et al. | |
| 6,408,219 B2 | 6/2002 | Lamey, Jr. et al. | |
| 6,611,948 B1 | 8/2003 | Tyler et al. | |
| 7,024,640 B2 * | 4/2006 | Buchanan | 716/4 |
| 7,284,214 B2 * | 10/2007 | LeBritton et al. | 716/5 |
| 7,363,207 B2 | 4/2008 | Kamon | |
| 7,406,671 B2 * | 7/2008 | Corbeil et al. | 716/5 |
| 7,467,365 B2 * | 12/2008 | Chang et al. | 716/5 |
| 2005/0044514 A1 | 2/2005 | Wu et al. | |
| 2005/0132306 A1 | 6/2005 | Smith et al. | |
| 2006/0026539 A1 | 2/2006 | Tetelbaum et al. | |
| 2006/0123380 A1 | 6/2006 | Ikeuchi | |
| 2007/0055892 A1 | 3/2007 | Pikus | |
| 2007/0201442 A1 | 8/2007 | Hekmatpour et al. | |
| 2007/0234246 A1 | 10/2007 | Sinha et al. | |
| 2007/0266356 A1 | 11/2007 | Chang et al. | |

(Continued)

OTHER PUBLICATIONS

Office Action issued by the United States Patent and Trademark Office in related U.S. Appl. No. 11/960,900 dated Jul. 23, 2009, 24 pages.

(Continued)

*Primary Examiner* — Nghia M Doan
(74) *Attorney, Agent, or Firm* — Haynes and Boone, LLP (57) ABSTRACT

An automated system for checking an integrated circuit cell layout includes searching the cell layout for a sub-area containing a predefined identifier, determining a reference cell layout corresponding to the predefined identifier, verifying the cell layout by comparing the cell layout to the reference cell layout to determine if a cell is of concern, and reporting the cell of concern to a user.

20 Claims, 2 Drawing Sheets

U.S. PATENT DOCUMENTS

2007/0266362 A1  11/2007  Lai et al.
2007/0288219 A1  12/2007  Zafar et al.
2008/0010623 A1* 1/2008  Koizumi .......................... 716/5

OTHER PUBLICATIONS

Raghvendra, Srinivas et al., "DFM: Linking Design and Manufacturing," Proceedings of the 18th International Conference on VLSI Design Held Jointly with 4th International Conference on Embedded Systems Design, VLSID, 2005, pp. 705-708.

Tsujikawa, Hiroyuki et al., "Power-Supply Noise Reduction with Design for Manufacturability," IEICE Trans Fundamentals, vol. E88-A, No. 12, Dec. 2005, pp. 3421-3428.

Chappell, Jeff, "The Future is the FOUP-Company Business and Marketing," Electronic News, Jul. 17, 2000, 2 pages.

Chen, Kuan-Chou et al., "Integrated Circuits Industry/Front Opening Unified Pod Audo-Loading Structure", Knowledge Bridge, No. 22, Apr. 2002, 4 pages.

Ottesen, Craig, "Front Opening Pod (FOUP) Fire Protection: A General Overview", International Sematech, Nov. 5, 1999, 10 pages.

Ouyang, Charles et al., "An Analytical Model of Multiple ILD Thickness Variation Induced by Interaction of Layout Pattern and CMP Process", IEEE Transactions on Semiconductor Manufacturing, Aug. 2000.

Office Action issued by the United States Patent and Trademark Office in related U.S. Appl. No. 11/688,654 dated Sep. 3, 2008, 15 pages.

Office Action issued by the United States Patent and Trademark Office in related U.S. Appl. No. 11/688,654 dated Mar. 20, 2009, 24 pages.

Office Action Issued by the United States Patent and Trademark Office in related U.S. Appl. No. 11/688,654 dated Nov. 5, 2009, 24 pages.

* cited by examiner

SYSTEM, METHOD, AND COMPUTER PROGRAM PRODUCT FOR MATCHING CELL LAYOUT OF AN INTEGRATED CIRCUIT DESIGN

CROSS REFERENCE TO RELATED APPLICATIONS

This application claims the benefit of U.S. provisional patent application No. 60/909,270, filed on Mar. 30, 2007, the disclosures of which are incorporated herein by reference.

BACKGROUND

Semiconductor manufacturing companies, such as TSMC, generally provide a comprehensive portfolio/library of foundry proven silicon designs, such as cells, arrays, blocks, etc. to their customers for use as design building blocks for customer devices. The customer uses the provided library of building blocks to design the layout, shape, interconnection, and configuration of a proposed device. Once the design for the proposed device is completed by the customer, the design is forwarded to the semiconductor manufacturing company for the final stage of the design process (tape out) prior to manufacturing the proposed device.

However, the manufacturing process, which includes the initial tooling up for the proposed device at the foundry, is generally the most costly part of a proposed device's design. Therefore, the semiconductor manufacturing company generally conducts several tests on the proposed device design prior to proceeding with the tape out process. One example of pre-tape out testing is design rule checking (DRC), which generally includes determining whether the proposed device design satisfies a series of recommended parameters called design rules. Design rules are a series of manufacturing process specific parameters provided by semiconductor manufacturers that enable the designer to verify the correctness of a schematic and/or mask set. A design rule set specifies certain geometric and connectivity restrictions to ensure sufficient margins to account for variability in semiconductor manufacturing processes, to ensure that the device will operate properly once manufactured. Design rule checking is a major step during physical verification process for the proposed device design, and also generally includes layout verses schematic (LVS) checking, XOR checks, electrical rule checking (ERC), and Antenna Checks. These checks are designed to achieve an overall high yield and reliability in the proposed device once manufactured.

The semiconductor manufacturing companies may insert an intellectual property (IP) tag into each design, where each IP has a tag may identify vendor, product, and/or version information. Foundries may obtain IP information by scanning those IP tags from the customer or design house layouts to verify the IP correctness of the design in the layout, and to make sure that a customer has not moved the cells or changed the CAD layers from the IP in a manner that will cause functional problems in the circuit. However, foundries often times have problems scanning for IP, especially in the SRAM art. Generally, when a cell is tagged or marked to identify IP in the cell, the IP tag is on the top cell of the layout, however, when a design house uses IP in a product, such as an SRAM, they may reduplicate sub-cells for extending the SRAM size, which makes it difficult for the foundry to scan for IP tags. For example, a foundry may make available a 256 KB SRAM layout to design houses, and the design house may duplicate the IP from the layout multiple times and put the duplicated units together to build a 64 MB SRAM. In this situation, the top cell of the given IP will not be included in the 64 MB SRAM, and as such, the foundry cannot get any IP information from scanning the 64 MB SRAM layout.

In situations where the customer or design house has modified the layout in a manner that makes the IP tags unreadable, the cell layout verification must be conducted manually. For example, in situations where foundries have problems scanning for IP tags, the foundries must locate the cells containing the foundry IP manually from CAD layers, which covers all of the layout area. Once the cells containing the IP are found, they must then be manually compared to the cells of the original IP, which is a time consuming and inaccurate task. Therefore, it would be desirable to have a system, method, or software package that enhances cell recognition and verification of IC design.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Finally, the exemplary embodiments presented below may be combined in various ways, i.e., any element from one embodiment may be used in any other embodiment, without departing from the invention.

Figure 1:
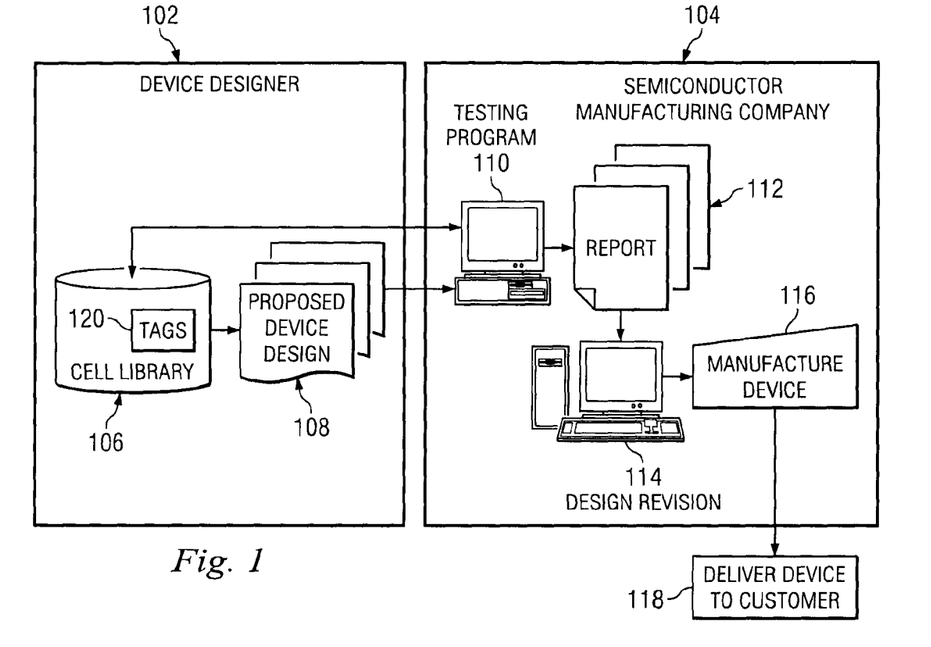
FIG. 1 illustrates an exemplary integrated circuit testing and checking system and methodology of the invention.

FIG. 1 illustrates an exemplary integrated circuit testing and checking system and methodology of the invention. In the exemplary system and methodology illustrated in FIG. 1, a customer 102 of a semiconductor manufacturing company (SMC) 104 desires to have an integrated circuit-type device manufactured by the SMC 104. The SMC 104 provides the customer 102 with a library 106 of integrated circuit cell, block, and/or array design parameters. The library 106 of verified and approved available cell designs generally includes proprietary information and intellectual property developed by the SMC 104 that the customer 102 may be allowed to use, subject to various conditions, in the design of a proposed device. The library 106 generally includes basic graphic data system (GDS) information, which is a binary format for representation of planar geometric shapes, text labels, and other device design information in hierarchical form that may be used by an e-beam writer to create masks, for example. The objects in the GDS file information are grouped by numeric attributes and reflect the physical layout of the device. The library 106 may also include netlist information, i.e., information defining the connectivity of the cells, blocks, or arrays in the device design.

The customer 102 uses the information contained in library 106 to create a proposed device design 108. The customer, who is generally sophisticated in integrated circuit design and capable of utilizing the library 106 as a building block for the proposed device, will generally run tests on the proposed device design to confirm integrity and operational characteristics of the proposed device. Once the customer is satisfied with the proposed device design 108, the proposed device design is forwarded to the SMC 104 to manufacture the proposed device. However, in an exemplary embodiment of the present invention, upon receiving the proposed device design 108, the SMC 104 conducts a testing process 110 on the proposed device design 108 prior to proceeding with the tape out process. The testing process 110, which is further detailed herein, may generally be configured to test, check, or verify design validity of the proposed device in accordance with the provided library 106 of cell designs, confirm IP usage, determine design version compliance, determine misuse of a cell and CAD layer information, to determine layout or cell customization issues, or to conduct any combination of these tests, verifications, or checks.

Once the SMC testing process 110 on the proposed device design 108 is completed, a report 112 is generated that details the results of the testing process 110. The report 112 is forwarded for design revision 114, if necessary. The design revision 114, which is generally conducted by a computer program operated by a design engineer at SMC 104 (or automatically by the computer program in some embodiments of the invention), may be configured to address and correct any issues presented in the report 112. In some embodiments of the invention, the report 112 will be forwarded back to the customer 102 for review and consideration of the suggested changes to the proposed design 108. Once the proposed device design 108 has been corrected or revised by the design revision program 114, the design may be forwarded to the device manufacturing facility 116, which may be a semiconductor processing mask facility configured to generate the masks necessary to fabricate the proposed device. Once the device is manufactured, then the device may be delivered to the customer at 118.

In one embodiment of the invention, the process of SMC 104 testing the proposed device design 108 may be conducted by an electronic testing device, such as a computer running a testing program stored thereon, wherein the testing program is configured to verify design validity in accordance with the provided library of designs, confirm IP usage, determine design version compliance, to determine misuse of a cell and CAD layer, or to determine layout or cell customization. In this embodiment of the invention, the proposed device design may be electronically analyzed, tested, or checked by the computer program for predefined conditions.

In an embodiment of the invention, the SMC 104 provides the cell library 106 to the customer 102 for device design; however, the SMC 104 may insert or imbed inert tags 120 in the cell library 106 data, as illustrated in FIG. 1. The inert tags 120 may be text strings, general objects, GDS objects, binary strings, netlistings, or other identifiers that are identifiable by the SMC 104 in the proposed device design file 108 when returned to SMC 104 to start the manufacturing process. However, the tags 120 are generally imbedded in the data in a manner such that the tags 120 are not visible to the customer 102 during the device design process, i.e., the tags 120 are generally transparent to the user; and further, the tags 120 do not have an impact on the design file, i.e., the tags 120 are inert to the design file information.

For example, the cell library 106 may contain cell design specifications for several standard and proven cells provided by the SMC 104 for use in designing a proposed device. These standard cell designs will generally be blocks of information that specify the layout and interconnection points for a particular type of cell that is used by the customer as a building block for the proposed device. The cell design blocks may be in the form of a graphic data system (GDS) file, which is a binary format for representation of planar geometric shapes, text labels, or some other information in hierarchical form that is used to specify the individual material layers in an integrated circuit. The tag 120 may be imbedded into the GDS file, remain transparent to the user, and still be easily searched and identified by the SMC 104 in the proposed design file 108. The tags 120 may be inserted into the standard design cells to assist with version control and customer usage validity checking. Additionally, the tags 120 may be used to construct automation for version verification and identify areas in the proposed design that are candidates for cell layout checking.

The tags 120 may be used by the SMC 104 to search through the proposed device design 108 to find the cells, components, arrays, blocks, etc. that include the design cells provided by SMC 104. For example, in one embodiment of the invention, the testing process includes scanning the entire proposed device design file 108 for tags 120 to determine what cells of the proposed device design 108 originated from the cell library 106. Therefore, the tags 120 may not only be used to identify stock cells from the cell library 106, but also cells that originated from the cell library that the designer has modified, as the tags 120 are embedded in the cell file in a manner such that they are transparent to the user and would not be removed during a design modification.

Figure 2:
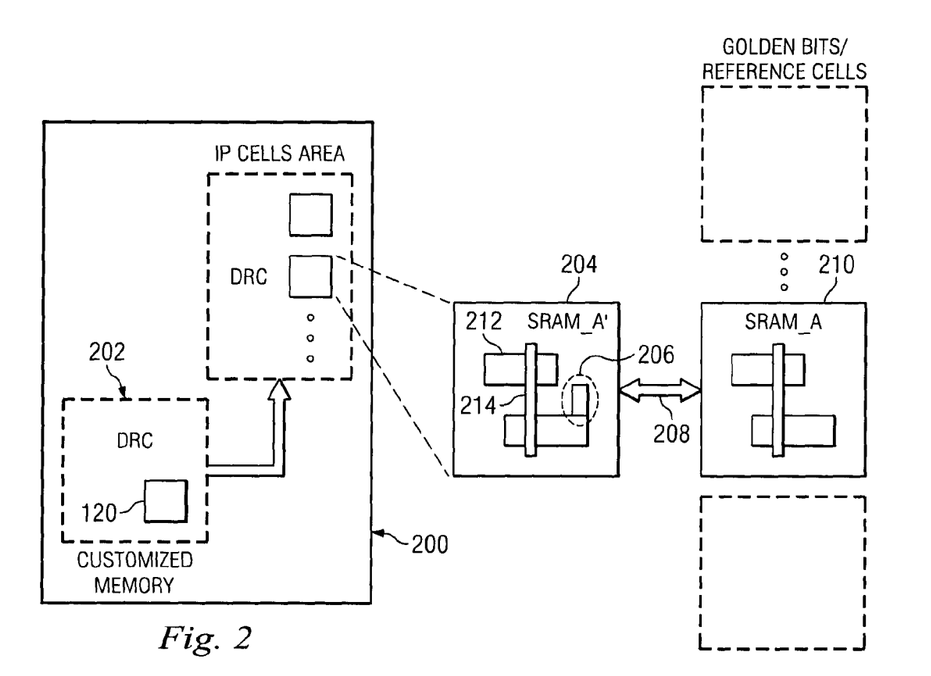
FIG. 2 illustrates an exemplary SRAM IP layout and sanity checking process of the invention.

FIG. 2 illustrates an exemplary IP layout and sanity checking process of the invention. In the checking process illustrated in FIG. 2, SRAMs are illustrated as the devices being checked, however, embodiments of the invention are not limited to SRAM checking. Rather, the testing and checking processes of the invention may be applied to any integrated circuit design process. Returning to FIG. 2, element 200 represents the customer's proposed device design file (similar to 108 in FIG. 1) that has a plurality of cells (or design arrays) 202 therein. The cells 202 may include tags 120 therein, and as such, the tags 120 may be searched and identified in the proposed design file 200. The tags 120 may be IP tags configured to mark SMC's intellectual property that is generally provided to customers for their use in designing devices, generally subject to various contractual and confidentiality conditions. Once the IP tags 120 are identified, the associated cell 202 may be tested or checked to verify design validity in accordance with the provided library 106 of designs, confirm IP usage, determine design version compliance, to determine misuse of a cell and CAD layer, or to determine layout or cell customization.

In the present exemplary embodiment, the testing process, which may be a part of a design rule check (DRC) process, includes a comparison of the identified cell/array 202 for compliance with an identified cell library design layout that is generally created and approved by the SMC 104. The cell library standard cell/array designs provided by the SMC 104 may generally be referred to as "golden bits" 210, as shown in FIG. 2, and therefore, once a cell/array 202 is identified in the testing process via the tag IP 120, the cell/array 202 may be compared to the golden bits, as illustrated by 208. Thus, the IP tag search yields cells and arrays 202 that include the IP tags 120 found in the customer's proposed design layout that is presented as being ready for tape-out, and each cell 204 of the identified cells or arrays 204 may be compared to the golden bits 210 in the testing process.

The comparison of the customer's proposed cell layout with the golden bits, which is generally done with a computer program configured to search for the IP tags 120, generally includes comparing tagged cells to the corresponding golden bits to determine any differences in the designs. The method and system of the invention may determine which golden bit to compare to the customer's proposed cell layout by referencing the IP tag found in the customer's proposed layout. If the IP tag 120 is not available, the method and system of the invention may use other tags, markings, or text strings to associate a cell layout received from a customer with a golden bit cell layout in the SMC's 104 library.

When a substantive difference 206 between the design cells 108 and the golden bits 210 is determined, then the difference 206 is noted on the report 112 for possible corrective action in a design revision process. An example of a difference 206 that would require corrective action, would be when the designer (customer) changed the cell design provided by the SMC 104 in a manner that would likely cause a device failure once manufactured. Another difference 206 that would require design correction may be when the designer (customer) implements a change 206 that infringes upon an intellectual property right, e.g., the customer may only be licensed to use a certain cell library that does not include the feature provided by the change 206. Other examples where the comparison to the golden bits may be useful would be in determining misuse of a cell and CAD layer, improper cell arrangement, process issues known to SMC 104, or layout/layer customization conflict that would cause device failure or poor operational performance.

In the exemplary embodiment of the invention illustrated in FIG. 2, diffusion may be represented by 212, and poly may be represented by 214. As such, the abnormality 206 (when compared to the reference cell list 210) may generally represent an extended diffusion polygon that is likely to cause improper cell operation or functionality. Therefore, the reference cell list 210 may be merged into tape-out database on the IP Cell Area 204, and the method may scan for a flag, and recognize that "SRAM_A" (as shown in FIG. 2) is a cell of concern. Thereafter, the method may sort cell information and map "SRAM_A" to the reference cell list 210, and compare "SRAM_A" of tape-out database with "SRAM_A" of reference cell list 210, and then highlight the difference between the two cell layouts.

In at least one exemplary embodiment of the invention, the IP cells area may be scanned to determine if the spacing between the respective poly and diffusion zones, for example, is proper and within the SMC's specifications for proper operation. In this exemplary embodiment, the reference cells 210 may be merged into tape-out database on the IP Cells Area 204, scanned for flags, and recognize that "SRAM_A" is a cell of concern. The system or method may then sort cell information and map to "SRAM_A" of the reference cell list 210, and compare "SRAM_A" from the customer's tape-out database with the model or template "SRAM_A" from the reference cell list from the SMC 104, and highlight the difference layout. The process may be used to locate inconsistencies in width and space of diffusion as required by the SMC 104.

Additionally, as the method and system of exemplary embodiments of the invention scans the IP cells area for tags or other marking elements, such as text strings, the tags themselves may be checked. For example, the tag or text string may be checked to determine if the text in the tag is correct, if the location of the tag is correct, or if the information contained in the tag is correct and accurate in view of the customer's intended purpose of the tape-out. In instances where the tag contains text, for example, the text may indicate the version number or edit number of the cell layout, which allows the SMC 104 to update the layout if a more recent version of the cell layout is currently available (to improve performance or to avoid known problems that may be associated with outdated cell layouts).

In at least one exemplary embodiment of the invention, the comparison of the IP cell area 204 to the reference list 210 may be used to determine misuse of a CAD layer or to determine if a layer is missing in a diffusion. For example, referring to FIG. 2, in an embodiment where the diffusion layers 212 have not been formed, then the present exemplary embodiment may be used to determine that a processing step that is used to generate the diffusion layers or zones 212 has been skipped, and as such, the appropriate layers of the cell have not been formed. In this embodiment, the Reference Cells 210 may be merged into tape-out database on the IP cells area, and the flags scanned to determine or recognize that "SRAM_A" is a cell of concern, as noted in previous embodiments. The cell information is sorted and mapped to the reference list's SRAM_A, and the SRAM_A from the tape-out database is compared with the SRAM_A from the Reference Cell List 210 to determine and highlight the differences between the two layouts, where a difference may be misusage of a CAD layer in diffusion is highlighted.

Additionally, in at least one exemplary embodiment of the invention, the misusage of cells, including dummy cells, strapping cells, edge cells, corner cells or array bit-cells may be determined and highlighted for the user. In this exemplary embodiment, the Reference Cells 210 are merged into tape-out database on to the IP cell area, the IP cell area is scanned for flags, and it is determined the SRAM_A is missing in tape-out database, as a located tag indicates that a cell should be present in a particular location (which may be an adjoining cell to a cell where a flag is located).

In general, the DRC testing and validation process is generally configured to check the proposed design against generic cell design and configuration rules provided to the customer by the SMC. The DRC testing and validation process may also check for device (SRAM) boundary rules, for proper cell arrangement in accordance with the appropriate SRAM array structures prescribed by the manufacturer, for process concerns, i.e., design elements that are not possible to manufacture given current technology, and CAD layer validity.

Figure 3:
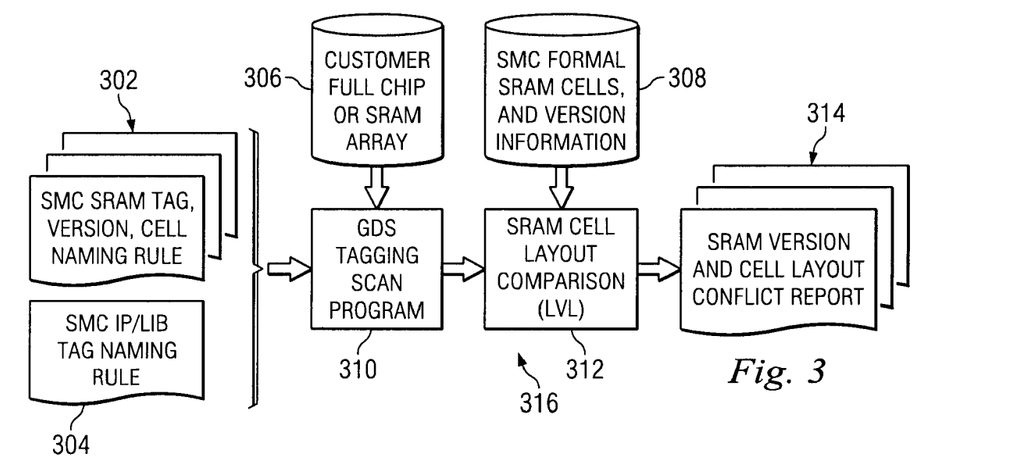
FIG. 3 illustrates an exemplary SRAM cell and array level testing process of the invention.

FIG. 3 illustrates an exemplary cell and array level testing process of the invention. The exemplary testing process illustrated in FIG. 3 is directed to tagging cells in an device version check that includes cell LVL (layout vs. layout), and DRC checking. As noted above, SRAMs are illustrated as the devices being checked, however, embodiments of the invention are not limited to SRAM checking. Rather, the testing and checking processes of the invention may be applied to any integrated circuit, SoC, or basic cell design element or device. The exemplary testing process illustrated in FIG. 3 may generally include an SRAM cell checking platform that is a hybrid of an electronic design automation (EDA) tool and a traditional language checking process. EDA is generally defined as a category of tools for designing and producing electronic systems ranging from printed circuit boards (PCBs) to integrated circuits, and is also sometimes referred to as ECAD or CAD. EDA is generally used to design device or cell schematics, and the output of the tool may be in formats such as Verilog, VHDL, SPICE, GDS, and other formats.

The exemplary process illustrated in FIG. 3 includes the checking platform 316, which may be a software package running on a personal computer or other microprocessor device, that is configured to receive input data, process the input data in accordance with a set of software instructions, and generate an output report in accordance with the software instructions representative of the testing process results. The platform 316 is configured to receive information such as the SMC 104 tags 120, the cell version information, and the cell naming rules, as illustrated in FIG. 3 at 302. The platform also receives the SMC 104 IP library tag naming rules, as indicated at 304. The platform 316 receives the customer's full device design array 306 and conducts a scanning process thereon, as illustrated at 310. The scanning process may be a GDS tag scan to configured to locate embedded GDS tags in the customer's design cells, and then to compare the version of the customer's cells to the SMC library 308. Additionally, the scanning process 310 may include a cell list check process.

Once the GDS testing process is completed, the testing process continues to 312, where an SRAM cell layout comparison process is conducted. The cell layout comparison may include a cell comparison process similar to the process illustrated in FIG. 2. However, in addition to the golden bit comparison, the layout comparison 312 generally includes a layer/layout verses layer/layout (LVL) comparison test to validate the proposed device layers compared to the SMC library 308. Once the GDS and LVL testing processes are completed, the testing process generates an SRAM version and cell layout conflict report that identifies each instance in the proposed design where the cell, array, or block is not compliant with the SMC golden bits, standard cells, or approved design layouts.

The cell layout comparison verification process 312 is generally configured to determine if the device (SRAM) is SMC compliant. The comparison verification process 312, however, also is configured to determine the tagged cell version and to compare the determined cell version to the supporting library to identify version mismatches. The comparison verification process 312 is also configured to compare the tag name to the cell name, and to determine if the function of the cell corresponds to the tag name and cell name, thus minimizing efforts to spoof the checking processes of the SMC. The comparison verification process 312 also determines if there is misuse of the cell and CAD layer, and makes sure the right layer is associated with the right tag and the correct cell name in the design file. Finally, the comparison verification process 312 is configured to use the tags and the cell libraries to determine if the customer has customized the layout (LVL check by cell).

Figure 4:
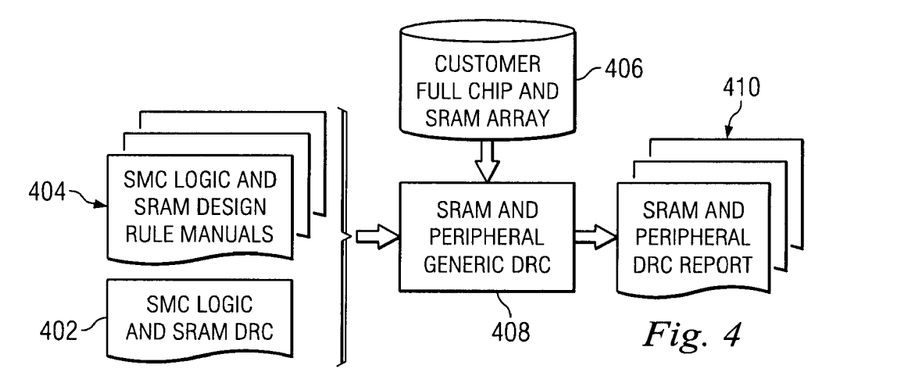
FIG. 4 illustrates an exemplary full chip or SRAM array level DRC testing process of the invention.

FIG. 4 illustrates an exemplary full chip or SRAM array level DRC testing process of the invention. As noted above, SRAMs are illustrated as the devices being checked, however, embodiments of the invention are not limited to SRAM checking. Rather, the testing and checking processes of the invention may be applied to any integrated circuit, SoC, or basic cell design element or device. The exemplary testing process illustrated in FIG. 4 is generally configured to test full chip DRC verification flow. The testing process receives as inputs the SMC logic and the SRAM DRC, as indicated at 402. Additionally, the testing process receives the SMC logic and SRAM design rule manuals, as indicated at 404. The testing platform 408 may generally be a computer program running on a computer configured to access the customer full chip and SRAM array 406 or another type or processing device capable of executing a program and conducting comparisons between data files. The testing platform 408 receives the SMC information (402 and 404) and receives the customer's proposed design information (406) and conducts an SRAM and peripheral generic DRC verification process on the proposed design information 406 by using the SMC information as a baseline comparison.

Therefore, embodiments of the invention generally provide a testing and verification process that allows SMCs to test all integrated circuit designs received from customers for various elements that were not previously checked. The checking and verification process is based upon tagging the cells in the SMC cell library provided to the customer, so that the customer's proposed device design may be searched for tagged cells, and the tagged cells compared to the golden bits/original designs of the SMC to determine what modifications or changes have been made to the cell before manufacturing. This tag based checking and verification system provides SMCs with the ability to check for issues such as design validity in accordance with the SMC's original cell designs, confirm SMC's intellectual property (IP) usage, determine design version compliance, to determine misuse of a cell and CAD layer, and to determine layout or cell customization issues, all before the proposed design file is sent to the mask facility to start the manufacturing process.

Embodiments of the invention may further provide a method for verifying an integrated circuit design. The method includes identifying cell tags embedded in a proposed integrated circuit design file, comparing cells identified as having a tag embedded therein to a cell library containing verified cell data to determine differences between the identified tagged cells and corresponding verified cell data from the cell library, and revising the proposed integrated circuit design to correct differences between the proposed integrated circuit design file and the verified cell data.

Embodiments of the invention may further provide a computer-readable medium having encoded thereon a process. The process, when executed by a processor, is configured to identify cell tags embedded in a proposed integrated circuit design file, compare cells identified as having a tag embedded therein to a cell library containing verified cell data to determine differences between the identified tagged cells and corresponding verified cell data from the cell library, and revise the proposed integrated circuit design to correct differences between the proposed integrated circuit design file and the verified cell data.

Embodiments of the invention may further provide a system for integrated circuit design verification. The system includes an identifying means for identifying cell tags embedded in a proposed integrated circuit design file, comparing means for comparing cells identified as having a tag embedded therein to a cell library containing verified cell data to determine differences between the identified tagged cells and corresponding verified cell data from the cell library, and revising means for revising the proposed integrated circuit design to correct differences between the proposed integrated circuit design file and the verified cell data.

Embodiments of the invention may provide a system or method for automatically scanning layouts for flags, marks, cell names, tagging, text, and CAD layers to identify cells that may have been modified in a manner that may impact the functionality of a device. Embodiments of the invention may further be configured to automatically compare a layout with a standard layout to identify the accuracy of the layout, function, version, cell and CAD layer usage. Further, embodiments of the invention may be configured to automatically execute DRC to verify cell/array arrangement, and process concerns, and to automatically compare layout portions to a standard layout to identify the accuracy in layout, function, version, cell and CAD layer usage. Embodiments of the invention may further be configured to automatically highlight differences in layout (as compared to the standard layout), function, version, cell/CAD layer usage, cell/array arrangement, and process concerns.

Figure 5:
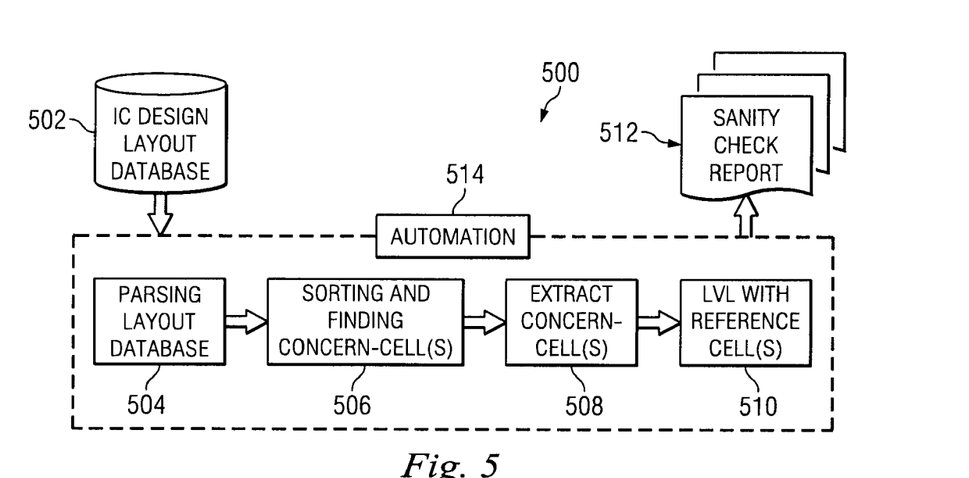
FIG. 5 illustrates a flowchart of an exemplary method of an embodiment of the invention.

FIG. 5 illustrates an exemplary method of an embodiment of the invention. The exemplary method 500 begins at 502 where an IC design layout database containing a plurality of IC cell designs is accessed and a design layout from the database is checked for errors. The design layout accessed may be a layout that is in the process of tape out and is nearly ready to begin the manufacturing process. At 504 of the method, the layout database is parsed, i.e., the IP area on the GDS database is located, which generally corresponds to finding a special IP region of the device block by marker layer of spatial text. At step 506, the method sorts and finds cell of concern. More particularly, the method may sort the cells into an element by element list via comparison of to a foundry template to determine what cells may include changes to the foundry provided cells that may have an impact upon the functionality or performance of the cell or device as a whole. Once the cells of concern are identified, they may be extracted at step 508, and thereafter, at step 510, the extracted cells may be processed through an LVL with reference cells, i.e., cells of concern may be compared to foundry cell templates or golden cells to determine differences (additions, subtractions, modifications, etc.) between the foundry templates/golden cells and the cells of concern taken from the tape out, which may be referred to as a sanity check. Once the sanity check of step 510 is completed, the method may generate and present a report to the user at step 512. The report may contain information such as identification of IC cells that have been modified from the golden cells, the potential impact the modifications to the cells may have upon the operation of the cell and/or the overall device, the presence or absence of the foundry IP tags, and any other information that may reasonably be gleaned from a comparison of the foundry template or golden layout to a cell from a tape out. The process illustrated in the exemplary embodiment of FIG. 5 may include automation of the steps represented by 504-510, wherein automation is generally defined as using a computer or other processing device to run a program that is configured to control the steps listed as 504-510. This automation process, although it may require minimal human interaction to operate, is generally configured to operate without human control and is configured to eliminate the tedious and time consuming process of manually checking each cell layout for errors.

In another exemplary embodiment of the invention, a method of cell recognition and verification of and IC design is provided. The exemplary method may include setting flag and/or mark into cell to identify cell information, i.e., function, version, and/or attribute. The flag may include information such as the CAD layer, the cell name, representative text, and/or IP or other tags. The method may further include sorting cell information, and mapping the sorted cell information to a foundry stock template or reference cell by an identified flag, tag, or cell mark. The method may further include automatically combining LVL and DRC processes to compare the cells identified to be of concern with the foundry template or golden cells, and then after the comparison between the identified cells of concern and the golden or template cell layout is completed, the method may include highlighting the difference in cell/CAD layer usage, function, version, cell/array arrangement, and process concerns to the user.

The exemplary method noted above allows a design reviewer to quickly and easily determine which cells are of concern and to critically analyze these particular cells, without wasting time comparing hundreds or thousands of cells to reference templates or golden cells only to determine that the cells are good and not in need of modification. Additionally, the combination of the LVL and DRC processes allows the exemplary method of the invention to scan for and identify foundry IP, which allows foundries to better protect their design IP and to prevent customer misuse of IP that could create costly legal issues in the future, and to improve correctness of IP cell mergence. Additionally the exemplary method also provides for flag customized layouts in design for review, and to flag process concerns for IP application or layout arrangement. Most importantly, the exemplary method may be used to reduce the substantial time and human resources that are conventionally required to recognize cells and verify cell/CAD layer usage, function, version, cell/array arrangement, and process concerns via the implementation of the above noted automated method for checking cell design layout.

Therefore, embodiments of the invention may generally provide an automated system and method for sanity checking an integrated circuit cell layout. The method generally includes searching the cell layout for a sub-area containing a predefined identifier, determining a reference cell layout corresponding to the predefined identifier, verifying the cell layout by comparing the cell layout to the reference cell layout to determine if a cell is of concern, and reporting the cell of concern to a user.

Embodiments of the invention may further provide a computer program embodied on a computer readable medium, that when executed by a processor, is configured to control an automated method for sanity checking an integrated circuit cell layout. The method may generally include searching the cell layout for a sub-area containing a predefined identifier, determining a reference cell layout corresponding to the predefined identifier, verifying the cell layout by comparing the cell layout to the reference cell layout to determine if a cell is of concern, and reporting the cell of concern to a user.

Embodiments of the invention may further provide a system for sanity checking an integrated circuit cell layout. The system may generally include a reference cell database containing reference cell layout designs, the original cell layout designs having a sub-area containing a predefined identifier, and a automated processing device configured to receive a cell layout, search the cell layout for cells containing predefined identifiers, comparing cells containing the predefined identifiers to corresponding reference cells to determine differences there between, and generating a report summarizing the differences.

Embodiments of the invention may further provide system for automatically sanity checking an integrated circuit cell layout. The system may generally include a searching means for searching the cell layout for a sub-area containing a predefined identifier, a determining means for determining a reference cell layout corresponding to the predefined identifier, a verifying means for verifying the cell layout by comparing the cell layout to the reference cell layout to determine if a cell is of concern, and a reporting means for reporting the cell of concern to a user The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An automated method for sanity checking an integrated circuit cell layout, comprising:
    searching, using an electronic testing device, the cell layout for a sub-area containing a predefined identifier, which includes an intellectual property (IP) tag, by electronically scanning or parsing a tape out database, and wherein the predefined identifier, including the IP tag, is transparent to one designing the cell layout and is inert to design file information for the cell layout by not impacting the cell layout;
    determining a reference cell layout corresponding to the predefined identifier;
    verifying the cell layout by comparing the cell layout that includes the predefined identifier in the cell layout for the sub-area to the reference cell layout to determine the cell layout is of concern; and
    reporting the cell layout of concern to a user.

2. The method of claim 1, wherein the IP tag comprises an indication of intellectual property owned by a semiconductor manufacturing company.

3. The method of claim 1, wherein the scanning or parsing comprises locating a scan flag, a mark, a cell name, a cell tag, tagging text, CAD layers of IP, or a cell layout.

4. The method of claim 1, wherein determining and comparing comprises automatically sorting cells of concern, automatically locating cells of concern, or automatically extracting cells of concern.

5. The method of claim 1, further comprising generating a summary report for the user, wherein the summary report includes layout version differences for cells of concern, layout function differences for cells of concern, design rule check (DRC) results for cells of concern, or layout-versus-layout (LVL) results for cells of concern.

6. The method of claim 1, further comprising automatically checking layout version, layout function, DRC, or LVL for cells of concern.

7. The method of claim 1, further comprising removing cells of concern from integrated circuit cell layout and replacing them with the reference cell layout.

8. The method of claim 1, wherein the predefined identifier comprises a text string, an electronic object, graphic data system (GDS) object, a binary string, or an element in a netlisting.

9. A computer program embodied on a computer readable storage device, that when executed by a processor, is configured to control an automated method for sanity checking an integrated circuit cell layout, comprising:
    searching the cell layout for a sub-area containing a predefined identifier, which includes an intellectual property (IP) tag, and wherein the predefined identifier, including the IP tag, is transparent to one designing the cell layout and is inert to design file information for the cell layout by not impacting the cell layout;
    determining a reference cell layout corresponding to the predefined identifier;
    verifying the cell layout by comparing the cell layout that includes the predefined identifier in the cell layout for the sub-area to the reference cell layout to determine the cell layout is of concern; and
    reporting the cell layout of concern to a user.

10. The computer program of claim 9, wherein searching the cell layout comprises electronically scanning or parsing a tape out database.

11. The computer program of claim 10, wherein the scanning or parsing comprises locating a scan flag, a mark, a cell name, a cell tag, tagging text, CAD layers of IP, or a cell layout.

12. The computer program of claim 9, wherein determining and comparing comprises automatically sorting cells of concern, automatically locating cells of concern, or automatically extracting cells of concern.

13. The computer program of claim 9, further comprising generating a summary report for the user, wherein the summary report includes layout version differences for cells of concern, layout function differences for cells of concern, design rule check (DRC) results for cells of concern, or layout-versus-layout (LVL) results for cells of concern.

14. The computer program of claim 9, further comprising automatically checking layout version, layout function, DRC, or LVL for cells of concern, and removing cells of concern from integrated circuit cell layout and replacing them with the reference cell layout.

15. The computer program of claim 9, wherein the predefined identifier comprises a text string, an electronic object, a graphic data system (GDS) object, a binary string, or an element in a netlisting.

16. A system for sanity checking an integrated circuit cell layout, comprising:
    a reference cell database containing reference cells layout, the cell layout designs having a sub-area containing a predefined identifier, which includes a cell tag, wherein the predefined identifier, including the cell tag, is transparent to one designing the cell layout and is inert to design file information for the cell layout by not impacting the cell layout; and
    a automated processing device configured to receive the cell layout, search the cell layout for cells containing predefined identifiers, comparing cells containing the predefined identifiers in the cell layout for the sub-area to corresponding reference cells layout to determine differences there between, and generating a report summarizing the differences.

17. The system of claim 16, wherein the automated processing device comprises a computer program running on a personal computer.

18. The system of claim 16, wherein the predefined identifiers comprise a text string, an electronic object, graphic data system object, a binary string, or an element in a netlisting.

19. The system of claim 16, wherein searching comprises parsing the cell layout to locate the cell tag, a scan flag, a mark, a cell name, tagging text, or CAD layers of intellectual property (IP).

20. A system for automatically sanity checking an integrated circuit cell layout, comprising:
    searching means for searching the cell layout for a sub-area containing a predefined identifier, which includes a cell tag, wherein the predefined identifier, including the cell tag, is transparent to one designing the cell layout and is inert to design file information for the cell layout by not impacting the cell layout;

determining means for determining a reference cell layout corresponding to the predefined identifier;

verifying means for verifying the cell layout by comparing the cell layout that includes the predefined identifier in the cell layout for the sub-area to the reference cell layout to determine the cell layout is of concern; and reporting means for reporting the cell layout of concern to a user.

* * * * *